(12) United States Patent
Chen et al.

(10) Patent No.: US 11,728,456 B2
(45) Date of Patent: Aug. 15, 2023

(54) SEMICONDUCTOR DEVICE

(71) Applicant: EPISTAR CORPORATION, Hsinchu (TW)

(72) Inventors: Meng-Yang Chen, Hsinchu (TW); Yuan-Ting Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/750,232

(22) Filed: May 20, 2022

(65) Prior Publication Data

US 2022/0285576 A1    Sep. 8, 2022

Related U.S. Application Data

(63) Continuation of application No. 16/875,354, filed on May 15, 2020, now Pat. No. 11,374,146.

(60) Provisional application No. 62/848,788, filed on May 16, 2019.

(30) Foreign Application Priority Data

Apr. 30, 2020   (TW) ................. 109114480

(51) Int. Cl.
   H01L 33/00   (2010.01)
   H01L 33/04   (2010.01)
   H01L 33/62   (2010.01)
   H01L 33/30   (2010.01)
   H01L 33/10   (2010.01)

(52) U.S. Cl.
   CPC ........... *H01L 33/002* (2013.01); *H01L 33/04* (2013.01); *H01L 33/10* (2013.01); *H01L 33/305* (2013.01); *H01L 33/62* (2013.01)

(58) Field of Classification Search
   CPC ....... H01L 33/002; H01L 33/04; H01L 33/10; H01L 33/305; H01L 33/62
   See application file for complete search history.

(56) References Cited

U.S. PATENT DOCUMENTS

| | | | |
|---|---|---|---|
| 11,374,146 B2 * | 6/2022 | Chen | ............. H01L 33/305 |
| 2011/0062466 A1 | 3/2011 | Tanaka et al. | |
| 2013/0256722 A1 | 10/2013 | Yang et al. | |
| 2019/0305185 A1 | 10/2019 | Lauermann et al. | |
| 2021/0091267 A1 | 3/2021 | Koslow et al. | |

FOREIGN PATENT DOCUMENTS

JP    H05-299691    11/1993

\* cited by examiner

*Primary Examiner* — Mark W Tornow
(74) *Attorney, Agent, or Firm* — Marquez IP Law Office, PLLC

(57) ABSTRACT

A semiconductor device is provided, which includes an active structure and a first semiconductor layer. The active structure includes an active region having a topmost surface and a bottommost surface, and a first dopant distributing from the topmost surface to the bottommost surface. The first semiconductor layer is located under the active structure and includes a second dopant. The active region includes a semiconductor material including As.

20 Claims, 8 Drawing Sheets

SEMICONDUCTOR DEVICE

CROSS REFERENCE TO RELATED APPLICATIONS

This application claims the right of priority based on U.S. patent application Ser. No. 16/875,354, filed on May 15, 2020, which claims the right of priority based on U.S. provisional patent application Ser. No. 62/848,788, filed on May 16, 2019 and TW application Serial No. 109114480, filed on Apr. 30, 2020, which also claims the benefit of U.S. provisional patent application Ser. No. 62/848,788, and each of which is incorporated by reference herein in their entirety.

FIELD OF DISCLOSURE

The present disclosure relates to a semiconductor device and in particular to a semiconductor light-emitting device such as a light-emitting diode.

BACKGROUND OF THE DISCLOSURE

Semiconductor devices are widely used in many applications. Various researches and developments of related material used in the semiconductor devices have been conducted. For example, a III-V group semiconductor material containing a III-group element and a V-group element may be applied to various optoelectronic devices, such as light emitting diodes (LEDs), laser diodes (LDs), photoelectric detectors, solar cells or power devices, such as switches or rectifiers. In recent years, the optoelectronic devices have been widely applied in fields including lighting, medical, display, communication, and sensing systems. The light-emitting diode, which is one of the semiconductor light-emitting devices, has the advantages of low energy consumption and long operating lifetime, and is therefore widely used in various fields.

SUMMARY OF THE DISCLOSURE

The present disclosure provides a semiconductor device. The semiconductor device includes an active structure, a first semiconductor layer, a second semiconductor layer, and an intermediate layer. The active structure includes an active region and a first dopant. The active region has a topmost surface and a bottommost surface. The first dopant distributes from the topmost surface to the bottommost surface. The first semiconductor layer is located under the active structure and includes a second dopant different from the first dopant. The second semiconductor layer is located on the active structure and includes the first dopant. The intermediate layer is located between the second semiconductor layer and the active structure and includes the first dopant. The first dopant has a first doping concentration in the second semiconductor layer, the first dopant has a second doping concentration in the active region, and the first doping concentration is greater than or equal to the second doping concentration.

The present disclosure further provides a semiconductor package structure including a carrier, a semiconductor device which is located on the carrier, and a layer of encapsulating material covering on the semiconductor device.

DETAILED DESCRIPTION OF THE DISCLOSURE

Figure 1:
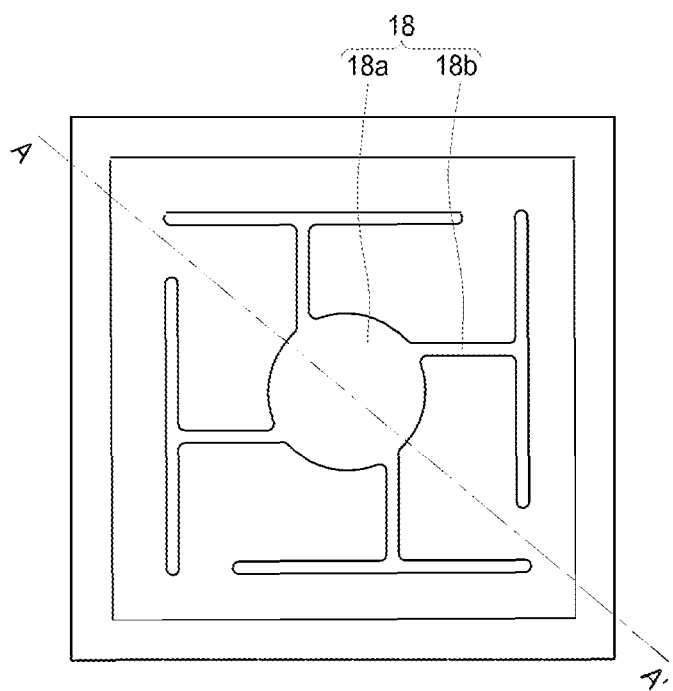
FIG. 1 shows a schematic top view of a semiconductor device in accordance with an embodiment of the present disclosure.

The following embodiments will be described with accompany drawings to disclose the concept of the present disclosure. In the drawings or description, same or similar portions are indicated with same numerals. Furthermore, a shape or a thickness of a component in the drawings may be enlarged or reduced. Particularly, it should be noted that a component which is not illustrated or described in drawings or description may be in a form that is known by a person skilled in the art.

In the present disclosure, if not otherwise specified, the general formula InGaAs represents $In_{z1}Ga_{1-z1}As$, wherein $0<z1<1$; the general formula InAlAs represents $In_{z2}Al_{1-z2}As$, wherein $0<z2<1$; the general formula InGaAsP represents $In_{z3}Ga_{1-z3}As_{z4}P_{1-z4}$, wherein $0<z3<1$ and $0<z4<1$; the general formula AlGaInAs represents $(Al_{z5}Ga_{(1-z5)})_{z6}In_{1-z6}As$, wherein $0<z5<1$ and $0<z6<1$; the general formula AlGaInP represents $(Al_{z7}Ga_{(1-z7)})_{z8}In_{1-z8}P$, wherein $0<z7<1$ and $0<z8<1$. The content of each element may be adjusted for different purposes, for example, for adjusting the energy gap, or the peak wavelength or dominant wavelength when the semiconductor device is a light-emitting device. However, the present disclosure is not limited thereto. Qualitative or quantitative analysis of the composition and/or dopant contained in each layer of the semiconductor device of the present disclosure may be conducted by any suitable method, for example, a secondary ion mass spectrometer (SIMS). A thickness of each layer may be obtained by any suitable method, such as a transmission electron microscopy (TEM) or a scanning electron microscope (SEM). In addition, the dopant mentioned in this disclosure may be added intentionally or unintentionally. In an intentional addition, for example, the dopant may be added by in-situ doping during epitaxial growth and/or by implantation using a p-type or n-type dopant after epitaxial growth. In an unintentional addition, the presence of the dopant may be diffused by the subsequent manufacturing process.

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Figure 2:
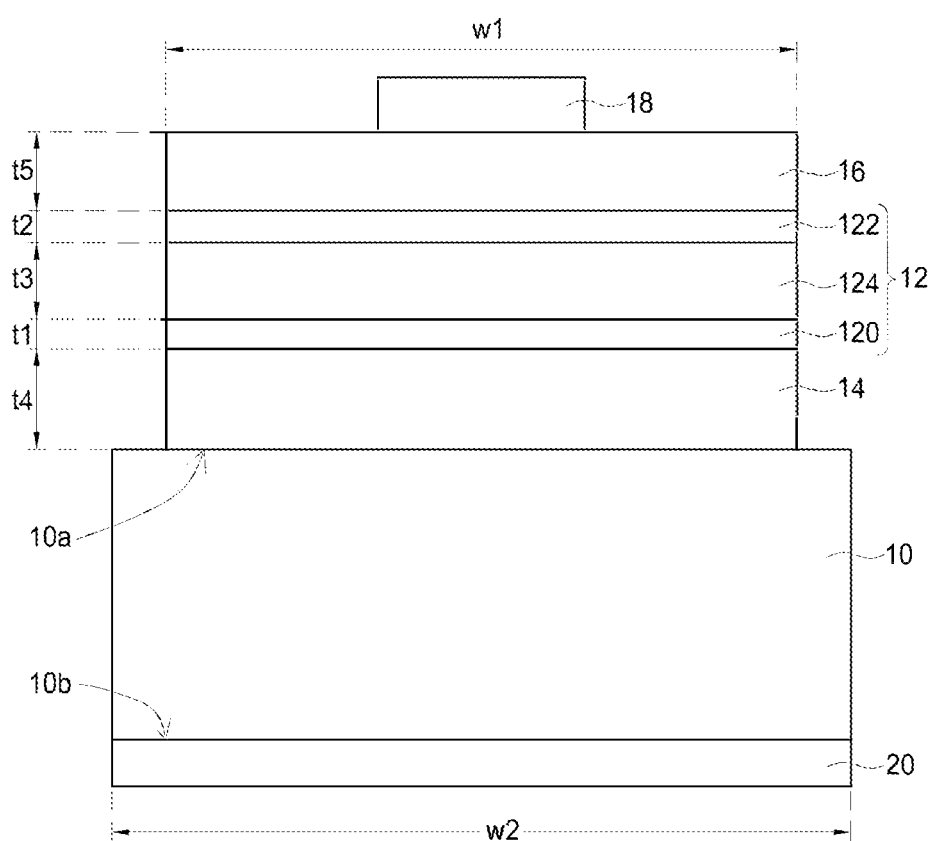
FIG. 2 shows a schematic sectional view of the semiconductor device along A-A' line in FIG. 1.

FIG. 1 shows a schematic top view of a semiconductor device 100 in accordance with an embodiment of the present disclosure. FIG. 2 shows a schematic sectional view of the semiconductor device 100 along A-A' line in FIG. 1.

As shown in FIG. 1, the semiconductor device 100 has a rectangular shape in a top view. In an embodiment, the semiconductor device 100 has a length and a width, and each of which is greater than or equal to 100 μm and less than or equal to 500 μm, such as 200 μm, 250 μm, 300 μm, 350 μm, 400 μm, or 450 μm. In an embodiment, the length and the width of the semiconductor device 100 are approximately equal. As shown in FIG. 2, the semiconductor device 100 of this embodiment includes a base 10, an active structure 12, a first semiconductor layer 14, a second semiconductor layer 16, a first electrode 18, and a second electrode 20. In some embodiments, the first semiconductor layer 14, the active structure 12, and the second semiconductor layer 16 may be grown on the base 10 by epitaxial growth or bonded to the base 10. That is, the base 10 may be a growth substrate or a non-growth substrate. The base 10 can support semiconductor layers or other structures thereon. The active structure 12 is located on a first side 10a of the base 10. The second electrode 20 may be located on a second side 10b of the base 10. In this embodiment, the second electrode 20 is adjacent to the base 10 and physically contacts a surface of the base 10. The first semiconductor layer 14 is located under the active structure 12. As shown in FIG. 2, the first semiconductor layer 14 is located between the base 10 and the active structure 12. The second semiconductor layer 16 is located on the active structure 12. The first electrode 18 is located on the second semiconductor layer 16. The semiconductor device 100 can emit a radiation during operation.

In an embodiment, the base 10 is a growth substrate and may be a conductive substrate, which may include a conductive material, such as gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The base 10 may be transparent, translucent (semi-transparent), or opaque to the radiation. For example, when the semiconductor device 100 emits near-infrared light having a peak wavelength greater than 1000 nm, the base 10 may have a transmittance of greater than 30% or an absorption rate of less than 30% to the near-infrared light. In some embodiments, the base 10 has a thickness greater than or equal to 60 μm and less than or equal to 250 μm, such as 100 μm, 130 μm, 140 μm, 150 μm, 160 μm, 170 μm, 180 μm, 200 μm, or 230 μm.

The semiconductor device 100 may include a single heterostructure (SH), a double heterostructure (DH), a double-side double heterostructure (DDH), or a multiple quantum well (MQW) structure. The radiation emitted by the semiconductor device 100 may be coherent or non-coherent and may be visible or invisible light. The visible light may be red light and the invisible light may be infrared light, such as near infrared light. When the radiation is near-infrared light, it may have a peak wavelength between 800 nm and 2000 nm (both included), such as 810 nm, 850 nm, 910 nm, 940 nm, 1050 nm, 1070 nm, 1100 nm, 1200 nm, 1300 nm, 1400 nm, 1450 nm, 1500 nm, 1550 nm, 1600 nm, 1650 nm, or 1700 nm. In an embodiment, the semiconductor device 100 only emits a non-coherent radiation and is not capable of emitting a coherent radiation. That is, the semiconductor 100 does not have a threshold current ($I_{th}$).

In this embodiment, the active structure 12 includes a first confinement layer 120, a second confinement layer 122, and an active region 124 located between the first confinement layer 120 and the second confinement layer 122. The active structure 12 may have a first width w1 and the base 10 may have a second width w2 greater than the first width w1. In an embodiment, the first confinement layer 120, the active region 124, and the second confinement layer 122 all include a ternary or quaternary semiconductor material. The ternary or quaternary semiconductor material may include aluminum (Al), gallium (Ga), arsenic (As), phosphorus (P), or indium (In), such as InGaAs, InGaAsP, or AlGaInAs. In an embodiment, the first confinement layer 120, the active region 124, and the second confinement layer 122 all contain arsenic (As).

In an embodiment, the first confinement layer 120 includes $In_{x1}Ga_{1-x1}As_{y1}P_{1-y1}$, wherein $0<x1<1$ and $0<y1<1$. In an embodiment, $0.5 \leq x1 \leq 0.9$ or/and $0.1 \leq y1 \leq 0.4$. In an embodiment, the second confinement layer 122 includes $In_{x2}Ga_{1-x2}As_{y2}P_{1-y2}$, wherein $0<x2<1$ and $0<y2<1$. In an embodiment, $0.5 \leq x2 \leq 0.9$ or/and $0.1 \leq y2 \leq 0.4$. In an embodiment, the active region 124 includes $In_{x3}Ga_{1-x3}As_{y3}P_{1-y3}$, wherein $0<x3<1$ and $0<y3<1$. In an embodiment, $0.5 \leq x3 \leq 0.9$ or/and $0.5 \leq y3 \leq 0.9$. In an embodiment, $x1>x3$ and $x2>x3$. In an embodiment, $y3>y1$ and $y3>y2$. The band gap of the first confinement layer 120 may have a first bandgap, the second confinement layer 122 has a second bandgap, the active region 124 has a third bandgap, and the first bandgap and the second bandgap are greater than the third energy gap. In an embodiment, the first confinement layer 120 has a first thickness t1, the second confinement layer 122 has a second thickness t2, and the active region 124 has a third thickness t3. The third thickness t3 may be greater than the first thickness t1 or/and the second thickness t2. In an embodiment, the third thickness t3 may be more than 3 times of the first thickness t1 or the second thickness t2, and less than 10 times of the first thickness t1 or the second thickness t2, for example, 4 times, 5 times, 6 times, 7 times, 8 times, and 9 times of the first thickness t1 or the second thickness t2. By having a relatively thick active region 124, the light emitting volume of the semiconductor device can be increased, thereby improving the light emitting efficiency. In an embodiment, the first thickness t1 and the second thickness t2 may be less than or equal to 90 nm and greater than 1 nm, for example, 80 nm, 70 nm, 60 nm, 50 nm, 40 nm, 30 nm, 20 nm, or 10 nm. In some embodiments, at a fixed operating current, compared to the semiconductor device with the first thickness t1 or the second thickness t2 not greater than 90 nm, the semiconductor device with the first thickness t1 or the second thickness t2 greater than 90 nm may have a higher forward voltage ($V_f$).

The first semiconductor layer 14 and the second semiconductor layer 16 are respectively located on two sides of the active structure 12 and are adjacent to the active structure 12. In an embodiment, the first semiconductor layer 14 has a fourth thickness t4, and the second semiconductor layer has a fifth thickness t5 greater than or equal to the fourth thickness t4. In an embodiment, the fifth thickness t5 may be more than 2 times and less than 10 times of the fourth thickness t4, for example, 3 times, 4 times, 5 times, 6 times, 7 times, 8 times, or 9 times. The first semiconductor layer 14 and the second semiconductor layer 16 may include aluminum (Al), gallium (Ga), arsenic (As), phosphorus (P) or indium (In), and may not contain nitrogen (N). The first semiconductor layer 14 and the second semiconductor layer 16 may respectively include at least two elements selected from aluminum (Al), gallium (Ga), arsenic (As), phosphorus (P), and indium (In).

The first semiconductor layer 14 and the second semiconductor layer 16 may include a binary, ternary, or quaternary III-V semiconductor material. In an embodiment, the first semiconductor layer 14 and the second semiconductor layer 16 respectively include a binary or a ternary semiconductor material, such as InP, GaAs, InGaAs, or InAlAs. In an embodiment, the first semiconductor layer 14 and/or the second semiconductor layer 16 may be doped by in-situ doping during epitaxial growth and/or by implantation after epitaxial growth. The second semiconductor layer 16 may include a first dopant to have a first conductivity type. The first semiconductor layer 14 may include a second dopant to have a second conductivity type. The second conductivity type is different from the first conductivity type. The first conductivity type may be p-type and the second conductivity type may be n-type to provide holes or electrons, respectively, or the first conductivity type may be n-type and the second conductivity type may be p-type to provide electrons or holes, respectively. In an embodiment, the first dopant or the second dopant may be magnesium (Mg), zinc (Zn), silicon (Si), or tellurium (Te).

In an embodiment, the active structure 12 includes the first dopant. Specifically, the first dopant may be distributed in the active region 124. In an embodiment, the active region has a topmost surface and a bottommost surface, and the first dopant may be distributed from the uppermost surface to the lowermost surface of the active region. In some embodiments, the active region 124 includes a plurality of well layers and a plurality of barrier layers which are alternately stacked, and the first dopant may be distributed in each well layer and each barrier layer. Furthermore, the uppermost surface may be defined by the upper surface of the uppermost layer (e.g. well layer or barrier layer) of the active region 124, and the lowermost surface may be defined by the bottom surface of the lowermost layer (e.g. well layer or barrier layer) of the active region 124. In an embodiment, the first dopant can be continuously distributed in the active structure 12 (as indicated by the line S1 in region II shown in FIG. 4). In an embodiment, the first dopant may distribute between the first confinement layer 120 and the second confinement layer 122 (both included) in the active structure 12. In other words, the first confinement layer 120, the active region 124, and the second confinement layer 122 may all include the first dopant. In an embodiment, the first dopant only distributes in the active region 124 and the second confinement layer 122 of the active structure 12, and the first confinement layer 120 does not contain the first dopant. In an embodiment, the first dopant only distributes in the active region 124 of the active structure 12, and the second confinement layer 122 and the first confinement layer 120 do not contain the first dopant. The doping concentration of the first dopant in the active region 124 may be in the range of $5\times10^{15}$ cm$^{-3}$ to $1.5\times10^{18}$ cm$^{-3}$. In an embodiment, the doping concentration of the first dopant in the active region 124 can be less than or equal to $1\times10^{18}$ cm$^{-3}$, or even less than or equal to $5\times10^{17}$ cm$^{-3}$. In an embodiment, the doping concentration of the first dopant in the active region 124 can be greater than or equal to $1\times10^{16}$ cm$^{-3}$, greater than or equal to $5\times10^{16}$ cm$^{-3}$, or even greater than or equal to $1\times10^{17}$ cm$^{-3}$.

In some embodiments, by including the first dopant in the active structure 12, characteristics of the semiconductor device may be further improved, for example, the luminous efficiency may be improved. Specifically, the first dopant may enter the first confinement layer 120, the active region 124, and/or the second confinement layer 122 from the second semiconductor layer 16 by diffusion. For example, the first dopant is not deliberately added to the first confinement layer 120, the active region 124 and/or the second confinement layer 122 during the epitaxial growth process of forming the first confinement layer 120, the active region 124, and/or the second confinement layer 122. Or, the first dopant may be intentionally added to the first confinement layer 120, the active region 124, and/or the second confinement layer 122. In another embodiment, the active structure 12 may be composed of the active region 124, that is, the active structure 12 is devoid of the first confinement layer 120 and the second confinement layer 122. In this way, the manufacturing process can be further simplified and the stability of device production processes can be further elevated. In this case, the first dopant may be continuously distributed in the active region 124 through diffusion or intentional addition.

As described above, the first semiconductor layer 14 may provide electrons or holes. In addition, the first semiconductor layer 14 can also serve as a window layer (a light extraction layer) to increase the light extraction efficiency. According to an embodiment, the doping concentration of the second dopant in the first semiconductor layer 14 may be in the range of $1\times10^{15}$ cm$^{-3}$ to $1\times10^{19}$ cm$^{-3}$. In an embodiment, the doping concentration of the second dopant in the first semiconductor layer 14 can be $1\times10^{18}$ cm$^{-3}$ or less, or even $5\times10^{17}$ cm$^{-3}$ or less. In an embodiment, the doping concentration of the second dopant in the first semiconductor layer 14 can be $1\times10^{16}$ cm$^{-3}$ or more. In some embodiments, the maximum doping concentration of the second dopant in the first semiconductor layer 14 can be greater than or equal to the maximum doping concentration of the first dopant in the active region 124. A doping concentration of the first dopant in the first semiconductor layer 14 is less than or equal to a doping concentration of the second dopant in the first semiconductor layer 14. In some embodiments, through the first semiconductor layer 14, the doping concentration of the first dopant is smaller than that of the second dopant. In an embodiment, the doping concentration of the first dopant in the second semiconductor layer 16 may be less than or equal to the maximum value of the doping concentration of the second dopant in the first semiconductor layer 14. In an embodiment, the doping concentration of the first dopant in the second semiconductor layer 16 is greater than or equal to the doping concentration of the first dopant in the active region 124. The doping concentration of the first dopant in the second semiconductor layer 16 may be in the range of $1\times10^{17}$ cm$^{-3}$ to $1\times10^{19}$ cm$^{-3}$. In an embodiment, the doping concentration of the first dopant in the second semiconductor layer 16 can be $5\times10^{17}$ cm$^{-3}$ or more, or even $1\times10^{18}$ cm$^{-3}$ or more, and can be less than $5\times10^{18}$ cm$^{-3}$.

The first electrode 18 and the second electrode 20 can be electrically connected to an external power source and the active structure 12. The first electrode 18 may include a main electrode 18a and a plurality of extension electrodes 18b. As shown in FIG. 1, the main electrode 18a is located at the center of an upper surface of the semiconductor device 100, and a plurality of extension electrodes 18b surround the main electrode 18a and are connected to the main electrode 18a. In this embodiment, each extension electrode 18b has a T-shape. The material of the first electrode 18 or the second electrode 20 may include a metal oxide material, a metal, or an alloy. The metal oxide material may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) or indium zinc oxide (IZO). The metal may include germanium (Ge), beryllium (Be), zinc (Zn), gold (Au), platinum (Pt), titanium (Ti), aluminum (Al), nickel (Ni), or copper (Cu). The alloy may include at least two elements selected from the above-mentioned metals, such as germanium gold nickel (GeAuNi), beryllium gold (BeAu), germanium gold (GeAu), or zinc gold (ZnAu).

Figure 3:
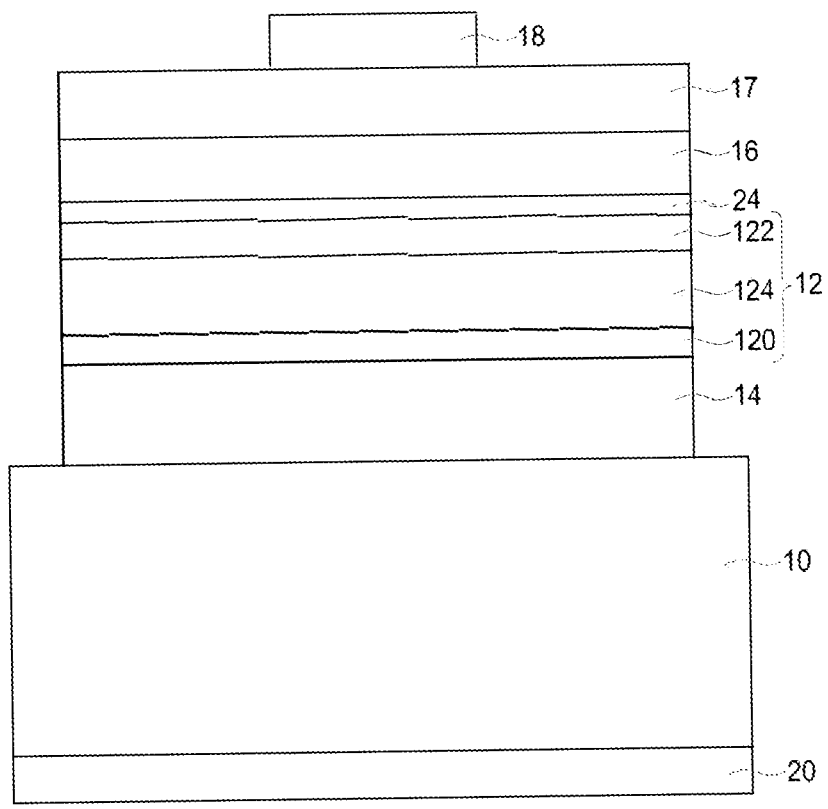
FIG. 3 shows a schematic sectional view of the semiconductor device in accordance with an embodiment of the present disclosure.

FIG. 3 shows a schematic sectional view of the semiconductor device 200 in accordance with an embodiment of the present disclosure.

The semiconductor device 200 is different from the semiconductor device 100 in that the semiconductor device 200 further includes the window layer 17 and the intermediate layer 24. The window layer 17 can be located between the second semiconductor layer 16 and the first electrode 18 and can serve as a light extraction layer to improve the luminous efficiency of the semiconductor device. The window layer 17 may include a binary, ternary, or quaternary semiconductor material. The window layer 17 may contain aluminum (Al), gallium (Ga), arsenic (As), phosphorus (P), or indium (In), and may not contain nitrogen (N). In an embodiment, the window layer 17 includes a binary, ternary, or quaternary semiconductor material containing phosphorus (P), indium (In), gallium (Ga), or arsenic (As). For example, the window layer 17 may include InP, GaAs, InAlAs, or AlGaInAs. The window layer 17 and the second semiconductor layer 16 may include the same or different binary, ternary, or quaternary III-V semiconductor material. The window layer 17 may also contain the first dopant. The doping concentration of the first dopant in the window layer 17 can be higher than the doping concentration of the first dopant in the second semiconductor layer 16. In an embodiment, the window layer 17 may have a first region and a second region (not shown), and the first region is closer to the first electrode 18 than the second region is. In an embodiment, the doping concentration of the first dopant in the first region is higher than that of the first dopant in the second region. Thereby, the electrical contact characteristics between the window layer 17 and the first electrode 18 can be further improved.

The intermediate layer 24 may be located between the second semiconductor layer 16 and the active structure 12, for example, located between the second semiconductor layer 16 and the second confinement layer 122. The intermediate layer 24 may contain aluminum (Al), gallium (Ga), arsenic (As), phosphorus (P), or indium (In), and may not contain nitrogen (N). Examples include phosphorus (P), indium (In) or gallium (Ga), and arsenic (As). The intermediate layer 24 may include a binary semiconductor material. In an embodiment, the intermediate layer 24 and the second semiconductor layer 16 include the same binary III-V semiconductor material, such as InP or GaAs. In some embodiments, when the intermediate layer 24 and the second semiconductor layer 16 include the same semiconductor material, the interface between the intermediate layer 24 and the second semiconductor layer 16 may be less obvious under SEM or TEM analysis, that is, the intermediate layer 24 and the second semiconductor layer 16 may be virtually a single layer under SEM or TEM analysis.

In some embodiments, the intermediate layer 24 may also include the first dopant. The first dopant may enter the intermediate layer 24 from the second semiconductor layer 16 by diffusion, that is, the first dopant is not deliberately added to the intermediate layer 24. For example, in the process of forming the intermediate layer 24 by epitaxial growth, the first dopant is not added at all. Specifically, the intermediate layer 24 can serve as a diffusion control layer for adjusting a diffusion distance of the first dopant toward the active structure 12 and the first semiconductor layer 14. In some embodiments, an over-diffusion of the first dopant may cause the first dopant passing through the active structure 12 to the first semiconductor layer 14, so that the first dopant in the first semiconductor layer 14 may have a high doping concentration (e.g., $1 \times 10^{17}$ cm$^{-3}$ or more). The over-diffusion may result in a device failure in some cases. Therefore, the doping concentration of the first dopant in the first semiconductor layer 14 can be lower than $1 \times 10^{17}$ cm$^{-3}$, or even lower than $5 \times 10^{16}$ cm$^{-3}$. In some embodiments, the intermediate layer 24 may have a thickness ranging from 30 nm to 250 nm, such as 40 nm, 50 nm, 60 nm, 70 nm, 80 nm, 90 nm, 100 nm, 110 nm 120 nm, 130 nm, 140 nm, 150 nm, 160 nm, 170 nm, 180 nm, 190 nm, 200 nm, 210 nm, 220 nm, 230 nm or 240 nm.

In some embodiments, when the thickness of the intermediate layer 24 is less than 30 nm, the effect of controlling diffusion may be less significant, so that the first semiconductor layer 14 may have a high doping concentration (e.g., $1 \times 10^{17}$ cm$^{-3}$ or more) of the first dopant. In some embodiments, in the case where the active structure 12 is composed of the active region 124 (i.e., the active structure 12 does not contain the first confinement layer 120 and the second confinement layer 122), the thickness of the intermediate layer 24 may be in a range of 100 nm to 250 nm, and may further be in a range of 150 nm to 250 nm. Thereby, the semiconductor device can have better luminous efficiency. In some embodiments, when the active structure 12 includes the first confinement layer 120, the active region 124, and the second confinement layer 122, and the thickness of the intermediate layer 24 exceeds 150 nm, a peak wavelength of the radiation emitted by the semiconductor device may be shifted. Therefore, the thickness of the intermediate layer 24 can be within a range of 150 nm or less. Based on the above, the intermediate layer 24 is useful to control the doping concentration of the first dopant in the active structure 12, so that photoelectric characteristics of the semiconductor device can be easily adjusted.

Figure 4:
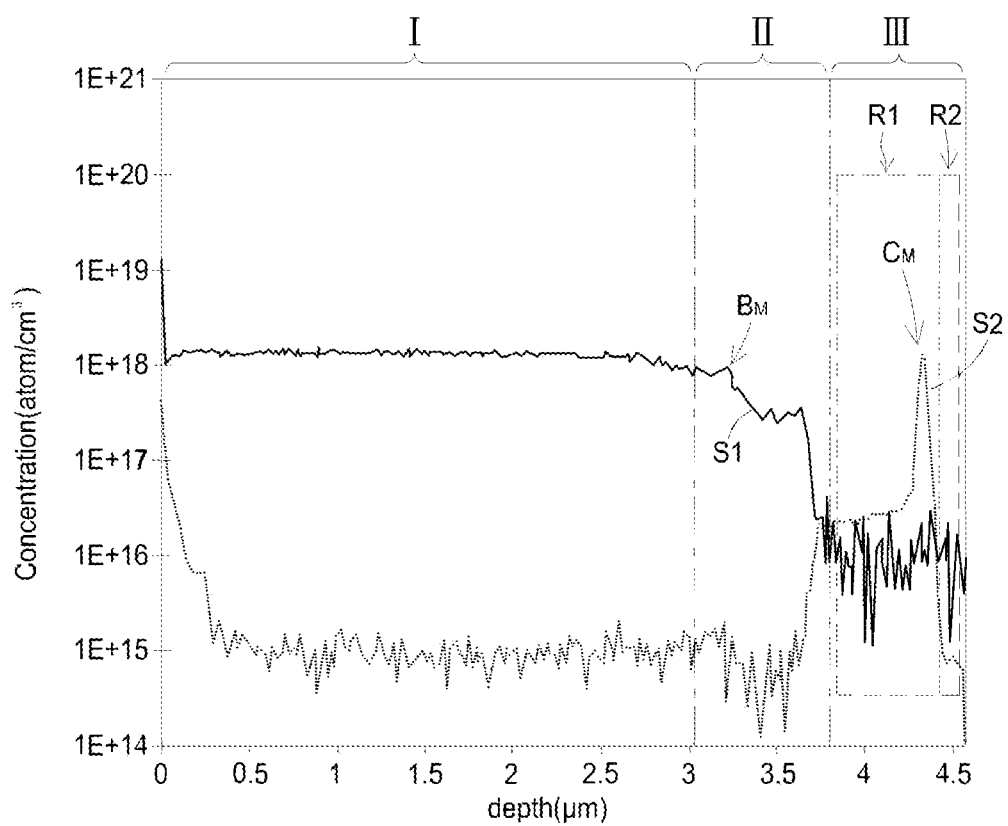
FIG. 4 shows a SIMS profile of a portion of an epitaxial structure in a semiconductor device according to an embodiment of the present disclosure.

FIG. 4 shows a SIMS profile of a portion of an epitaxial structure in the semiconductor device 200 according to an embodiment of the present disclosure.

Referring to FIG. 4, in which the region I may correspond to the second semiconductor layer 16 and the intermediate layer 24, the region II may correspond to the active structure 12, and the region III may correspond to the first semiconductor layer 14. Line S1 in FIG. 4 represents the doping concentration curve of the first dopant, and line S2 represents the doping concentration curve of the second dopant. In this embodiment, the first semiconductor layer 14, the intermediate layer 24, and the second semiconductor layer 16 all contain In and P, and the active structure 12 contains In, Ga, As, and P. In this embodiment, the intermediate layer 24 and the second semiconductor layer 16 include the same semiconductor material, so the interface between the intermediate layer 24 and the second semiconductor layer 16 may be less obvious under SEM or TEM analysis, and the intermediate layer 24 and the second semiconductor layer 16 may be virtually a single layer under SEM or TEM analysis.

It can be seen from FIG. 4 that the first dopant is mainly distributed in the region I and the region II, and the doping concentration of the first dopant in the region I is greater than that of the first dopant in the region II. The second dopant can be mainly distributed in the region III, and the maximum concentration $C_M$ of the second dopant in the region III is greater than the maximum concentration $B_M$ of the first dopant in the region II. In the region III, the doping concentration of the first dopant can be significantly less than the maximum concentration $C_M$ of the second dopant. In the region III, the doping concentration of the first dopant may be 1/10 or less of the maximum concentration $C_M$ of the second dopant. The region III can be divided into a first part R1 (left side) close to the region II and a second part R2 (right side) away from the region II. As shown in FIG. 4, in the first part R1, the doping concentration of the first dopant can be less than or equal to the doping concentration of the second dopant. In the second part R2, the doping concentration of the second dopant can be less than or equal to the doping concentration of the first dopant. The doping concentration of the first dopant in the region III may be less than $1 \times 10^{17}$ cm$^{-3}$.

In some embodiments, the semiconductor device 200 may include the window layer 17 without the inclusion of the intermediate layer 24, or include the intermediate layer 24 without the inclusion of the window layer 17. For the positions, materials, and related descriptions of other layers or structures, the foregoing embodiments can be referred to, and are not repeatedly described herein.

Figure 5:
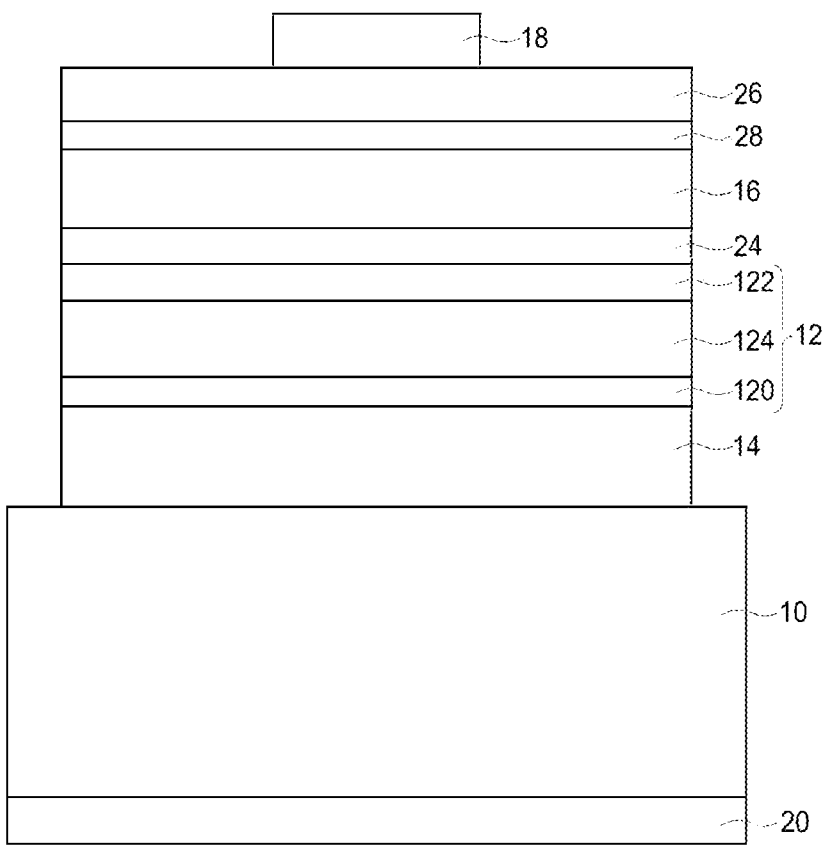
FIG. 5 shows a schematic sectional view of the semiconductor device in accordance with an embodiment of the present disclosure.

FIG. 5 shows a schematic sectional view of the semiconductor device 300 in accordance with an embodiment of the present disclosure.

The difference between the semiconductor device 300 and the semiconductor device 100 is that the semiconductor device 300 further includes an intermediate layer 24, a contact layer 26, and a transient layer 28. In this embodiment, the contact layer 26 is located between the second semiconductor layer 16 and the first electrode 18. By providing the contact layer 26, the electrical contact characteristics between the second semiconductor layer 16 and the first electrode 18 can be further improved.

The contact layer 26 may contain aluminum (Al), gallium (Ga), arsenic (As), phosphorus (P), or indium (In), and may not contain nitrogen (N). In an embodiment, the contact layer 26 and the second semiconductor layer 16 may include one same element. For example, both the contact layer 26 and the second semiconductor layer 16 include indium (In), gallium (Ga), or arsenic (As). The contact layer 26 may include a binary or ternary semiconductor material. In an embodiment, the contact layer 26 includes a ternary III-V semiconductor material, and the second semiconductor layer 16 includes a binary III-V semiconductor material. In an embodiment, the contact layer 26 includes a binary III-V semiconductor material, and the second semiconductor layer 16 includes a ternary III-V semiconductor material. In an embodiment, the contact layer 26 includes GaAs or InGaAs. The contact layer 26 may further include a third dopant, and the doping concentration of the third dopant in the contact layer 26 may be greater than the doping concentration of the first dopant in the second semiconductor layer 16. The contact layer 26 may have the same conductivity type (p-type or n-type) as the second semiconductor layer 16. The third dopant may be magnesium (Mg), zinc (Zn), silicon (Si), or tellurium (Te), and may be the same as or different from the first dopant. The doping concentration of the third dopant in the contact layer 26 may be greater than or equal to $1 \times 10^{18}$ cm$^{-3}$, for example, greater than or equal to $2 \times 10^{18}$ cm$^{-3}$, or even greater than or equal to $4 \times 10^{18}$ cm$^{-3}$, and may be less than or equal to $2 \times 10^{19}$ cm$^{-3}$, for example, less than or equal to $1 \times 10^{19}$ cm$^{-3}$ Specifically, the thickness of the transition layer 28 may be greater than that of the contact layer 26. In an embodiment, the transition layer 28 includes a quaternary semiconductor material. The transition layer 28 may contain aluminum (Al), gallium (Ga), arsenic (As), phosphorus (P), or indium (In), and may not contain nitrogen (N). In an embodiment, the transition layer 28 and the contact layer 26 may include two same elements selected from indium (In), gallium (Ga), and arsenic (As). The transition layer 28 may include the same quaternary semiconductor material as the active region 124. In an embodiment, the transition layer 28 includes $In_{x4}Ga_{1-x4}As_{y4}P_{1-y4}$, where $0<x4<1$, $0<y4<1$. In an embodiment, $0.5 \leq x4 \leq 0.9$, $0.5 \leq y4 \leq 0.9$. In an embodiment, when the transition layer 28 includes $In_{x4}Ga_{1-x4}As_{y4}P_{1-y4}$ and the active region 124 includes $In_{x3}Ga_{1-x3}As_{y3}P_{1-y3}$, $x4 \geq x3$ and $y4 \geq y3$. In an embodiment, the transition layer 28 may further include a fourth dopant. The doping concentration of the fourth dopant in the transition layer 28 may be greater than or equal to the doping concentration of the first dopant in the second semiconductor layer 16. The transition layer 28 may have the same conductivity type (p-type or n-type) as the second semiconductor layer 16. The fourth dopant may be magnesium (Mg), zinc (Zn), silicon (Si), or tellurium (Te), and may be the same as or different from the first dopant.

In some embodiments, the semiconductor device 300 may include the contact layer 26 without inclusion of the transition layer 28, or include the transition layer 28 without inclusion of the contact layer 26. For the positions, materials, and related descriptions of other layers or structures, the foregoing embodiments can be referred to, and are not repeatedly described herein.

Figure 6:
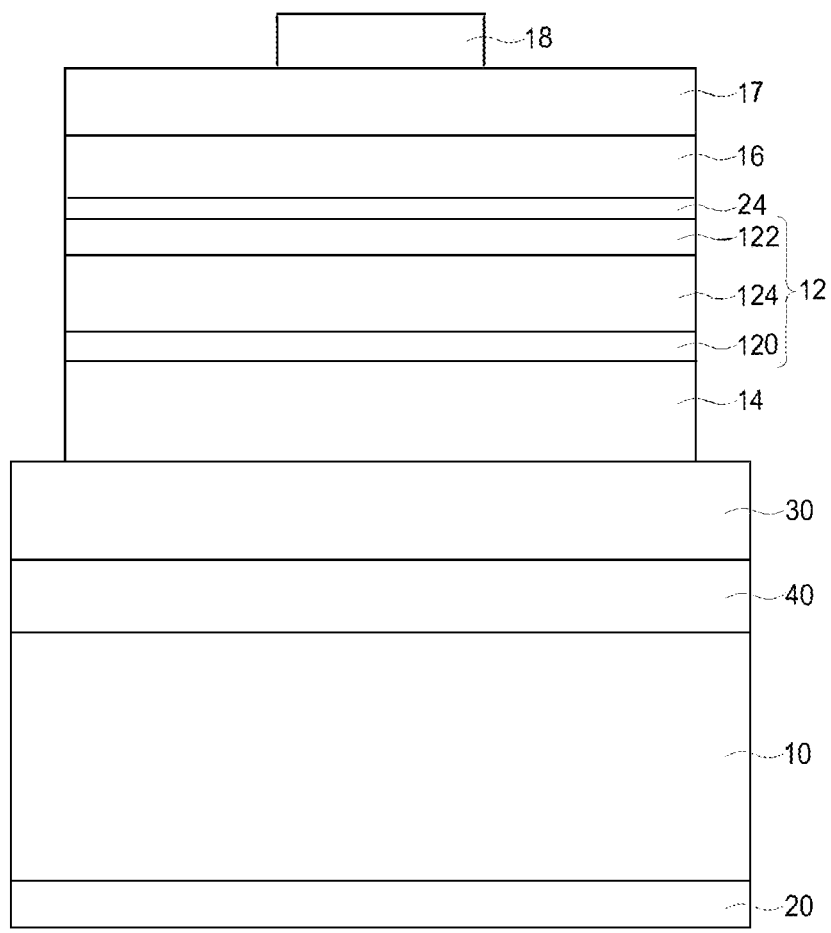
FIG. 6 shows a schematic sectional view of the semiconductor device in accordance with an embodiment of the present disclosure.

FIG. 6 shows a schematic sectional view of the semiconductor device 400 in accordance with an embodiment of the present disclosure.

The difference between the semiconductor device 400 and the semiconductor device 200 is that the semiconductor device 400 further includes a reflective structure 30 and an adhesive structure 40. In this embodiment, the base 10 may be a non-growth substrate, and the first semiconductor layer 14, the second semiconductor layer 16, the active structure 12, other semiconductor layers and the reflective structure 30 are bonded to the base 10 through the adhesive structure 40.

The reflective structure 30 is located between the adhesive structure 40 and the first semiconductor layer 14. Specifically, the reflective structure 30 may be a single layer or multiple layers. In an embodiment, the reflective structure 30 may reflect the radiation emitted by the semiconductor device 400 towards the second semiconductor structure 16 and out of the semiconductor device 400. The material of the reflective structure 30 may be conductive and may include metal or alloy. The metal may be copper (Cu), aluminum (Al), tin (Sn), gold (Au), silver (Ag), lead (Pb), titanium (Ti), nickel (Ni), platinum (Pt), or tungsten (W). The alloy may include two elements selected from the above metals. In an embodiment, the reflective structure 30 includes a first metal layer, a second metal layer, and a third metal layer (not shown). The first metal layer may be adjacent to the first semiconductor layer 14, the second metal layer may be adjacent to the adhesive structure 40, and the third metal layer may be located between the first metal layer and the second metal layer. According to an embodiment, the first metal layer, the second metal layer, and the third metal layer may respectively contain aluminum (Al), gold (Au), silver (Ag), titanium (Ti), or platinum (Pt). In an embodiment, the first metal layer, the second metal layer, or the third metal layer may be an aluminum (Al) layer, a gold (Au) layer, a silver (Ag) layer, a titanium (Ti) layer, or a platinum (Pt) layer. In an embodiment, the materials of the first metal layer, the second metal layer and the third metal layer are different. In an embodiment, the reflective structure 30 may include a conductive DBR (Distributed Bragg Reflector) structure.

The adhesive structure 40 connects the base 10 and the reflective structure 30. In an embodiment, the adhesive structure 40 may include two or more layers (not shown). The material of the adhesive structure 40 is conductive and may include a transparent conductive material, metal or alloy. The transparent conductive material may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), indium gallium oxide (IGO), gallium aluminum zinc oxide (GAZO), graphene, or a combination thereof. The metal may include copper (Cu), aluminum (Al), tin (Sn), gold (Au), silver (Ag), lead (Pb), titanium (Ti), nickel (Ni), platinum (Pt) or Tungsten (W). The alloy may include two elements selected from the above metals.

In another embodiment, similar to FIG. 6, the intermediate layer 24 is not located between the second semiconductor layer 16 and the active structure 12, but is located between the first semiconductor layer 14 and the active structure 12. For example, the intermediate layer 24 is located between the first semiconductor layer 14 and the first confinement layer 120. In this case, the distribution of the first dopant and the second dopant in the first semiconductor layer 14 and the intermediate layer 24 corresponds to the region I shown in FIG. 4, the distribution of the first dopant and the second dopant in the active structure 12 corresponds to the region II shown in FIG. 4, and the distribution of the first dopant and the second dopant in the second semiconductor layer 16 corresponds to the region III shown in FIG. 4. For example, the first dopant enters the intermediate layer 24 and the active structure 12 from the first semiconductor layer 14 by diffusion or enters the intermediate layer 24 and the active structure 12 by doping. The intermediate layer 24 can serve as a diffusion control layer for adjusting the diffusion distance of the first dopant toward the active structure 12 and the second semiconductor layer 16.

Figure 7:
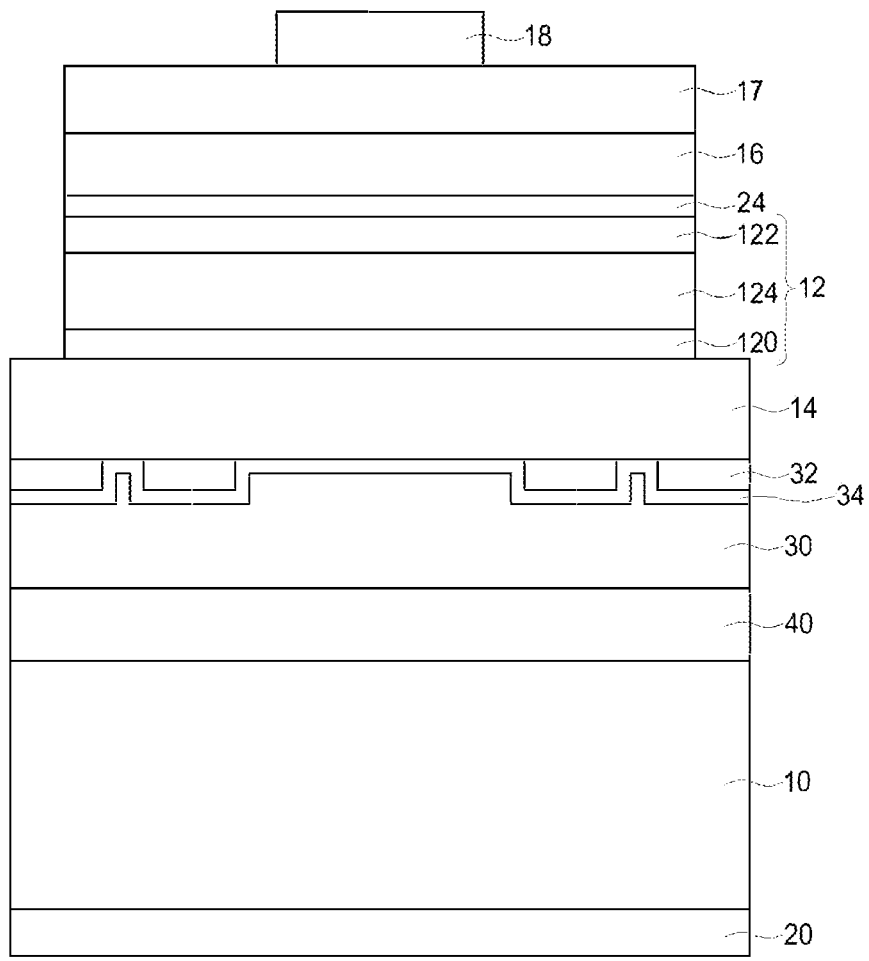
FIG. 7 shows a schematic sectional view of the semiconductor device in accordance with an embodiment of the present disclosure.

FIG. 7 shows a schematic sectional view of the semiconductor device 500 in accordance with an embodiment of the present disclosure.

The semiconductor device 500 is similar to the semiconductor device 400. The semiconductor device 500 further includes an insulating layer 32 located between the reflective structure 30 and the first semiconductor layer 14. As shown in FIG. 7, the insulating layer 32 covers a portion of the bottom surface of the first semiconductor layer 14. In this embodiment, a width of the first semiconductor layer 14 is greater than a width of the active structure 12. The material of the insulating layer 32 may include an oxide insulating material or a non-oxide insulating material. The oxide insulating material may include silicon oxide ($SiO_x$) or similar materials, and the non-oxide insulating material may include silicon nitride ($SiN_x$), benzocyclobutene (BCB), cyclo olefin copolymer (COC) or fluorocarbon polymer, calcium fluoride ($CaF_2$) or magnesium fluoride ($MgF_2$). In this embodiment, the first electrode 18 and the insulating layer 32 do not overlap in a vertical direction. In an embodiment, along the vertical direction, the insulating layer 32 does not overlap with the main electrode 18a of the first electrode 18, but overlaps with the extension electrode 18b.

As shown in FIG. 7, the semiconductor device 500 further includes a conductive layer 34 covering the insulating layer 32. In the embodiment, the portion where the conductive layer 34 contacts with the first semiconductor layer 14 can form a current path. The conductive layer 34 may include a transparent conductive material, metal, or alloy. The transparent conductive material may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), zinc oxide (ZnO), gallium phosphide (GaP), indium cerium oxide (ICO), indium tungsten oxide (IWO), indium titanium oxide (ITiO), indium zinc oxide (IZO), Indium gallium oxide (IGO), gallium aluminum zinc oxide (GAZO), graphene, or a combination thereof. The metal may include copper (Cu), aluminum (Al), tin (Sn), gold (Au), silver (Ag), lead (Pb), titanium (Ti), nickel (Ni), platinum (Pt) or Tungsten (W). The alloy may include two elements selected from the above metals.

In some embodiments, the semiconductor device 500 may include the insulating layer 32 without the inclusion of the conductive layer 34, or may include the conductive layer 34 without the inclusion of the insulating layer 32. For the positions, materials, and related descriptions of other layers or structures, the foregoing embodiments can be referred to, and are not repeatedly described herein.

Figure 8:
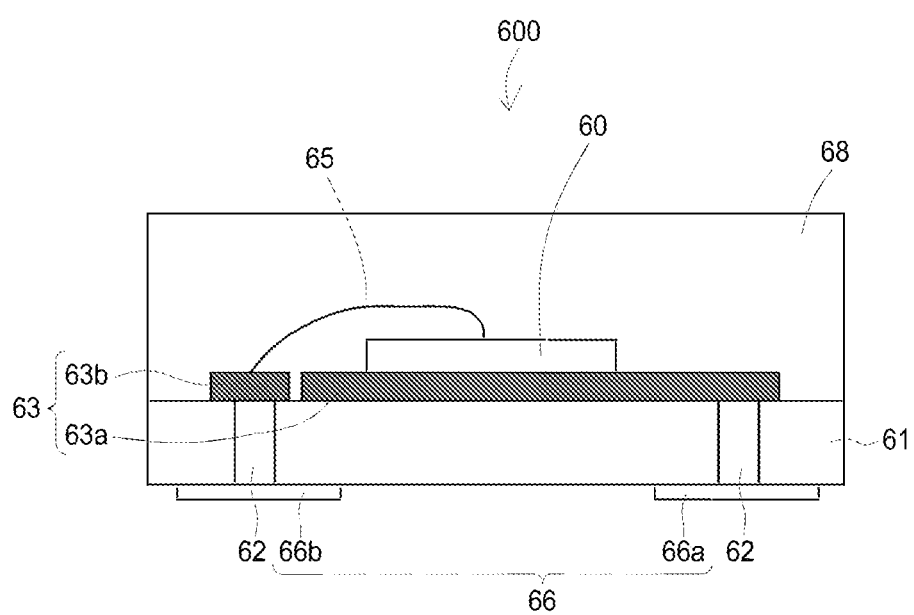
FIG. 8 shows a schematic sectional view of a semiconductor package structure in accordance with an embodiment of the present disclosure.

FIG. 8 shows a schematic sectional view of a semiconductor package structure 600 in accordance with an embodiment of the present disclosure.

As shown in FIG. 8, a package structure 600 which includes a semiconductor device 60, a package substrate 61, a carrier 63, a bonding wire 65, a contact structure 66 and an encapsulating material 68 is provided. The package substrate 61 may include a ceramic or glass. The package substrate 61 has a plurality of through holes 62. Each through hole 62 may be filled with a conductive material such as metal for electrical conduction and/or heat dissipation. The carrier 63 may be located on a surface of one side of the package substrate 61 and may also contain a conductive material such as metal. The contact structure 66 is on a surface on another side of the package substrate 61. In the embodiment, the contact structure 66 includes a first contact pad 66a and a second contact pad 66b, and the first contact pad 66a and the second contact pad 66b can be electrically connected to the carrier 63 through the through holes 62. In an embodiment, the contact structure 66 may further include a thermal pad (not shown) between the first contact pad 66a and the second contact pad 66b.

The semiconductor device 60 is located on the carrier 63 and may be the semiconductor device as described in any embodiments of the present disclosure. In the embodiment, the carrier 63 includes a first portion 63a and a second portion 63b, and the semiconductor device 60 is electrically connected to the second portion 63b of the carrier 63 by a bonding wire 65. The material of the bonding wire 65 may include metal, such as gold (Au), silver (Ag), copper (Cu), or aluminum (Al), or may include alloy containing one of the above elements. The encapsulating material 68 can cover the semiconductor device 60 to protect the semiconductor device 60. Specifically, the encapsulating material 68 may include a resin material, such as an epoxy resin, or a silicone resin. The encapsulating material 68 may further include a plurality of wavelength conversion particles (not shown) to convert a first light emitted by the semiconductor device 60 into a second light. The wavelength of the second light is greater than the wavelength of the first light.

Based on above, the semiconductor device provided in the present disclosure may exhibit a good epitaxial quality and improved optical-electrical characteristics, such as light-emitting power, wavelength stability and/or reliability.

Specifically, the semiconductor device of the present disclosure can be applied to products in various fields, such as illumination, medical care, display, communication, sensing, or power supply system. For example, the semiconductor device can be used in a light fixture, monitor, mobile phone, or tablet, an automotive instrument panel, a television, computer, wearable device (such as watch, bracelet or necklace), traffic sign, outdoor display device, or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, above-mentioned embodiments can be combined or substituted under proper condition and are not limited to specific embodiments described above. A connection relationship between a specific component and another component specifically described in an embodiment may also be applied in another embodiment and is within the scope as claimed in the present disclosure.

What is claimed is:

1. A semiconductor device, comprising:
   an active structure comprising:
      an active region having a topmost surface and a bottommost surface; and
      a first dopant distributing from the topmost surface to the bottommost surface;
   a first semiconductor layer located under the active structure and comprising a second dopant different from the first dopant;
   a second semiconductor layer located on the active structure and comprising the first dopant; and
   an intermediate layer located between the second semiconductor layer and the active structure and comprising the first dopant;
   wherein the first dopant has a first doping concentration in the second semiconductor layer, the first dopant has a second doping concentration in the active region, and the first doping concentration is greater than or equal to the second doping concentration.

2. The semiconductor device of claim 1, wherein the semiconductor device emits a non-coherent light.

3. The semiconductor device of claim 1, wherein the active region includes a ternary or quaternary semiconductor material.

4. The semiconductor device of claim 1, wherein the first dopant or the second dopant is magnesium (Mg), zinc (Zn), silicon (Si), or tellurium (Te).

5. The semiconductor device of claim 1, wherein the second doping concentration is less than or equal to $5\times10^{17}$ $cm^{-3}$.

6. The semiconductor device of claim 1, further comprising a reflective structure under the first semiconductor layer.

7. The semiconductor device of claim 6, wherein the reflective structure comprises a DBR structure.

8. The semiconductor device of claim 1, further comprising a window layer on the second semiconductor layer, and the window layer comprises the first dopant.

9. The semiconductor device of claim 8, wherein the first dopant has a third doping concentration in the window layer, and the third doping concentration is higher than the second doping concentration.

10. The semiconductor device of claim 1, wherein the first semiconductor has a first width, the active structure has a second width and the first width is greater than the second width.

11. The semiconductor device of claim 1, further comprising an insulating layer, the first semiconductor layer has a bottom surface, and the insulating layer covers a portion of the bottom surface.

12. The semiconductor device of claim 11, further comprising a first electrode on the active structure, wherein the first electrode and the insulating layer is not overlapped in a vertical direction.

13. The semiconductor device of claim 12, wherein the first electrode comprises a main electrode and a plurality of extension electrodes connected to the main electrode.

14. The semiconductor device of claim 11, wherein further comprising a conductive layer covering the insulating layer.

15. The semiconductor device of claim 1, further comprising a contact layer on the second semiconductor layer, and the contact layer comprises a third dopant different from the first dopant.

16. The semiconductor device of claim 15, further comprising a transition layer between the second semiconductor layer and the contact layer.

17. The semiconductor device of claim 16, wherein the transition layer includes a fourth dopant.

18. The semiconductor device of claim 1, further comprising a substrate under the first semiconductor layer and a bonding layer between the substrate and the first semiconductor layer.

19. The semiconductor device of claim 1, wherein the active region has a portion which the second dopant is distributed in.

20. A semiconductor package structure, comprising:
   a carrier;
   a semiconductor device of claim 1, located on the carrier; and
   a layer of encapsulating material covering on the semiconductor device.

* * * * *